United States Patent [19]

Norberg

[11] 4,031,464
[45] June 21, 1977

[54] LINE POWER DISTORTION DETECTOR

[75] Inventor: Gayle Russell Norberg, Columbia Heights, Minn.

[73] Assignee: Control Data Corporation, Minneapolis, Minn.

[22] Filed: Mar. 1, 1976

[21] Appl. No.: 662,318

[52] U.S. Cl. .............................. 324/78 Z; 328/150; 328/109; 328/140; 307/360
[51] Int. Cl.² ....................................... G01R 23/02
[58] Field of Search .............. 324/78 R, 78 Z, 103, 324/113, 181, 186; 328/115, 109, 135, 140, 150; 340/15.5 TC, 15.5 AC; 307/335 N

[56] References Cited
UNITED STATES PATENTS

| 3,327,230 | 6/1967 | Konian | 328/150 |
|---|---|---|---|
| 3,543,156 | 11/1970 | Hall et al. | 324/181 |
| 3,544,813 | 12/1970 | Bjerke | 324/181 |
| 3,582,974 | 6/1971 | Favin | 328/115 |
| 3,683,284 | 8/1972 | Mueller | 328/150 |
| 3,882,303 | 5/1975 | Linder | 324/78 Z |
| 3,958,183 | 5/1976 | Schaefer | 328/115 |

Primary Examiner—Rudolph V. Rolinec
Assistant Examiner—Michael J. Tokar
Attorney, Agent, or Firm—Edward L. Schwarz

[57] ABSTRACT

Apparatus for testing distortion of an AC power wave and providing an error signal if distortion of the type likely to cause DC output of a power supply receiving the AC power wave to fall below acceptable levels occurs.

7 Claims, 3 Drawing Figures

LINE POWER DISTORTION DETECTOR

BACKGROUND OF THE INVENTION

1. Field of the Invention

The proper performance of almost all electronic and many electro-mechanical devices is critically dependent on the characteristics of the voltage supplied to operate them. Usually, these devices have designed-in tolerance so that a certain amount of distortion in the applied voltage will not affect operation. However, operation degrades very rapidly once the designed-for tolerance for distortion is exceeded. Particularly in recent years, line power has become unreliable in this respect, with severe distortion of its voltage occurring enough to be a cause of major concern in the operation of these devices. Particularly in the case of electronic computers and their associated peripheral gear, it is important that conditions of unacceptably high distortion be detected relatively rapidly so that computation which might otherwise proceed erroneously can be halted with orderly system shutdown procedures until proper line or auxiliary power is available.

Of the various types of distortion, the effect which each has varies from one type of power supply to another. For example, in rectifier power supplies severe in-phase third harmonic distortion or severe peak shift distortion seriously affects the power supply output. On the other hand, out of phase third (and other odd) harmonic distortion does not seriously affect power supply output, even if severe. This is because in rectifier power supplies, the energy in the supply voltage above the proper filter voltage is unaffected by the out of phase third harmonic distortion, but significantly decreased by in-phase third harmonic or peak shift distortion.

2. Description of the Prior Art

The closest art of which applicant is aware is that represented by so-called power line disturbance analyzers as manufactured, for example by Dranetz Engineering Laboratories, South Plainfield, N. J. These devices measure such things as variations in steady state or RMS voltage, sudden changes in individual cycle voltage, spikes, and power interruptions. These kinds of errors will not always cause failure in a rectifier power supply. These deviations in the AC power wave may or may not be an error requiring system shutdown in other kinds of power supplies. The most serious problem, however, with these devices is that the power wave defects mentioned above cannot in many cases be detected by them. U.S. patents in this general area include U.S. Pat. Nos. 3,758,852 (Nowell, et al), frequency detector; 3,401,308 (Darke), current difference sensor between phases of a balanced three phase power wave; and 3,700,919 (Stitch), measuring direction of power flow.

BRIEF DESCRIPTION OF THE INVENTION

I have discovered that the effects of out of phase third harmonics, peak shift, and voltage sag, can be detected by appropriate processing of the times at which the AC wave reaches two different voltage excursions. The term "excursion" is used so as to include both positive and negative half cycles. The term "half cycle" refers to the entire positive or the entire negative portion of a single complete cycle of a phase of the AC wave. For purposes of this description, positive and negative half cycles can be treated in an identical manner. The time between adjacent first and second voltages levels in a half cycle of the AC power waves is compared to the time which elapses between the occurrence of two identical voltage levels in a sine wave having a nominal frequency and peak amplitude identical to that of the power wave. If the time which elapses between these two voltage levels in the power wave is within a preselected percentage of that for the ideal sine wave, then the undesirable in-phase odd harmonic and peak shift distortion modes are not present in an amount sufficient to affect power supply output excessively. For a typical rectifier power supply, the first and second voltage levels between which these times are measured are chosen to be 20% and 85% of peak amplitude. If the power wave time on either the leading or trailing edge of the half cycle deviates from the ideal sine wave time by more than 10% then power supply output may well vary 10% or more from design voltage at the specified load. For other types of power supplies, other first and second voltage levels may be chosen.

In the typical situation, it is desirable to monitor both leading and trailing edges of every half cycle in all phases of the AC wave. Most conveniently, each phase can be passed through a full wave rectifier bridge to change all half cycles to the same polarity. The rectified signal is then applied to threshold voltage detectors set at the 20% and 85% (or other desirable) levels and the time between detection of the two levels on the leading edge and again on the trailing edge is recorded in some fashion. Given the peak amplitude and the frequency, it is a simple task to determine the time in a true sine wave which elapses between these two identical voltage levels, and this time is permanently wired into the apparatus. The comparison can be made digitally by running a counter between the time of occurrence of adjacent first and second levels, or in an analog fashion by integrating a signal which is present only between the time of occurrence of the two voltage levels. If deviation from theoretical is excessive, then an error signal is generated and sent to the computer for processing. Since half cycles of AC power waves invariably occur at millisecond speeds and computer operation proceeds in the low microseconds, detection of an error in any one half cycle can be used to instantly shut down a system in an orderly fashion before power supply output has deteriorated to such an extent that the system using the converter output malfunctions.

Accordingly, one purpose of this invention is to prevent malfunction of electronic devices caused by power line distortion.

A second purpose is to prevent harm to electronic devices caused by variations in power supply output resulting from input power distortion.

Another purpose is to provide for orderly shutdown of electronic devices receiving excessively distorted power and substitution of backup systems with minimum delay.

A last purpose is to provide signals permitting analysis of power line distortion and correction, if possible, of the cause of the distortion.

DESCRIPTION OF THE PREFERRED EMBODIMENTS

Figure 1:
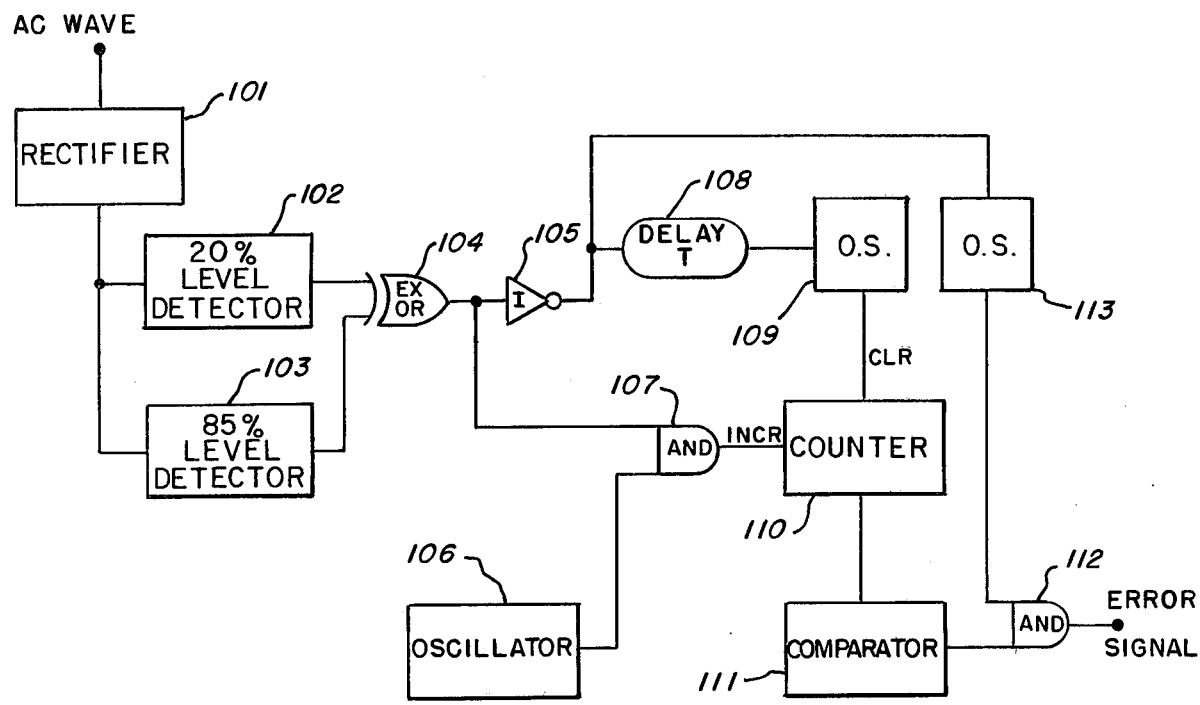
FIG. 1 discloses apparatus digitally comparing times between first and second voltage levels in the AC power and sine waves.
Figure 2:
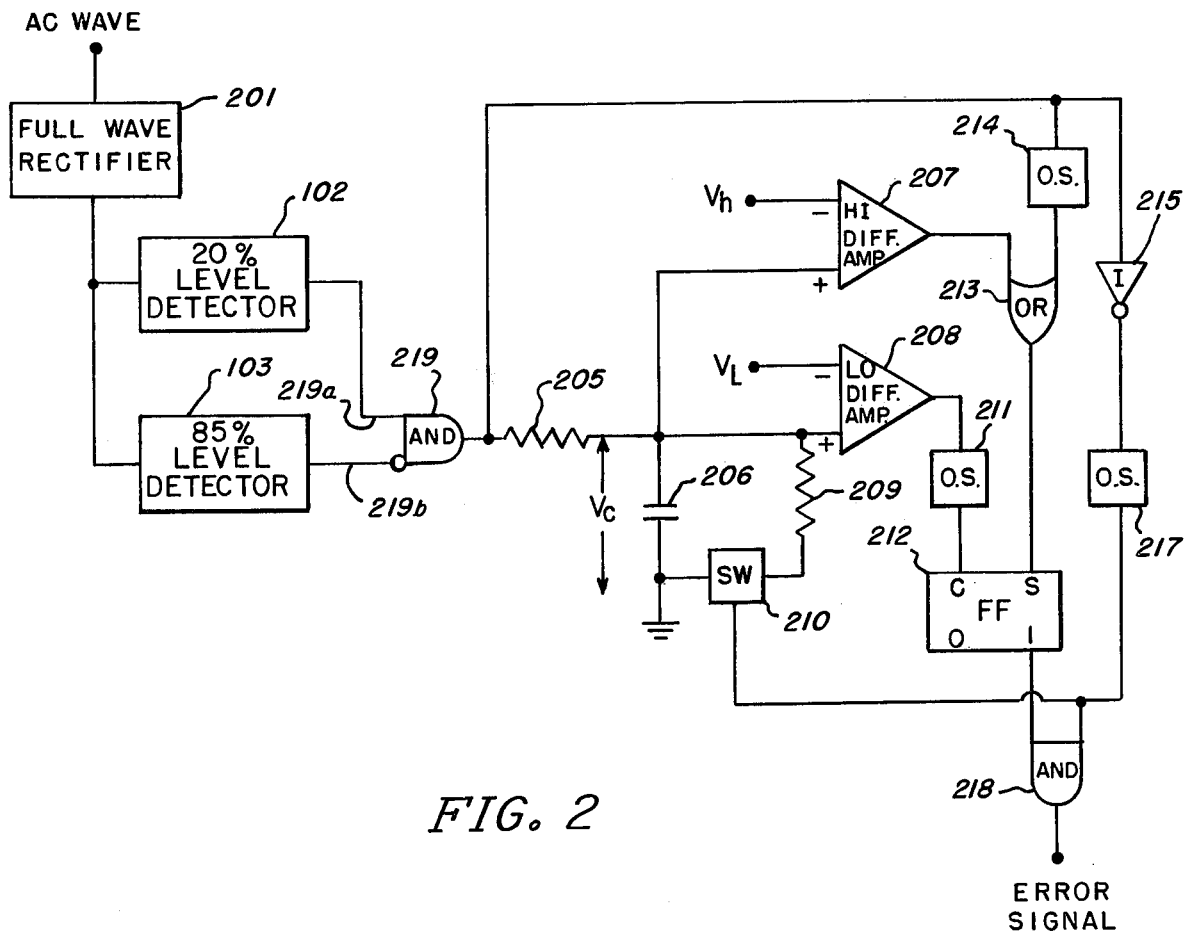
FIG. 2 discloses apparatus performing the comparison between first and second levels in the AC power and sine waves in an analog fashion.

In both FIGS. 1 and 2, it is assumed that all logic circuits produce outputs which may be either a binary 0 or a binary 1, represented respectively by a low voltage level and a high voltage level, when inputs to them are either binary 0's or 1's as represented by the same low and high voltage levels. In the case of analog devices supplying inputs to digital circuits, it is assumed that these inputs have been clamped in some manner, for example by zener diodes, to vary only between the low and high logic voltage levels. Certain other circuits which fall in neither category will be explained as the need arises.

Turning first to FIG. 1, the AC wave is received at the input of rectifier 101. Rectifier 101 is preferably a full wave rectifier, which thereby permits analysis of each half cycle in the particular phase. 20% level detector 102 provides a binary 1 at its output while the AC wave excursion from 0 v. is at least 20% of the nominal peak voltage of the AC wave. Similarly, 85% level detector 103 provides a binary 1 while the AC wave excursion exceeds 85% of nominal peak amplitude. Level detectors 102 and 103 provide a binary 0 while the AC wave excursion does not exceed a detector's associated level. It is possible to perform this level detection by the use of differential amplifiers and voltage standards such as those supplied by zener diodes. Adjustments may have to be made for possible voltage drops caused by rectifier 101. It is preferred, however, that the functions of rectifier 101 and level detectors 102 and 103 be replaced with the apparatus described in the patent application entitled "Multilevel Clipping Circuit" and having a common filing date and inventor with the instant application. Waveform 300 discloses a sample AC wave input to rectifier 101 and waveforms 301 and 302 are the outputs of level detectors 102 and 103 respectively.

The outputs of level detectors 102 and 103 form the inputs to exclusive OR gate circuit 104, whose output in turn is shown as waveform 303. The output of exclusive OR gate circuit 104 is applied to the input of inverter 105 and one of the inputs of AND gate 107, and the output of oscillator 106 supplies the other input for AND gate 107. The output of AND gate 107 is applied to the increment (INCR) terminal of counter 110. Each positive-going pulse on the INCR input of counter 110 advances the contents of the counter by 1. The output of inverter 105 is applied to the input of delay 108 and one-shot 113. Inverter 105 performs the standard logic operation of providing a binary 1 output responsive to a binary 0 input and a binary 0 output responsive to a binary 1 input. Delay 108 provides an output precisely following its input but delayed by time T. One-shot 109 receives the output of delay 108 and supplies its output to the clear (CLR) input of counter 110. The output of one-shot 109, normally 0, changes to a binary 1 for a preselected period of time responsive to a change from binary 0 to binary 1 at its input. The length of the binary 1 pulse applied by one-shot 109 to the CLR input of counter 110 need only be long enough to achieve the purpose of the input, viz. to set the contents of counter 110 to 0. The output of one-shot 109 is similarly set to 1 for a predetermined time responsive to each change from 0 to 1 at its input. For reasons appearing later, one-shot 113 set time must be less than T. The output of one-shot 113 is applied to one input of AND gate 112 to gate out the result of the measurement. Counter 110 is a typical off-the-shelf item and may have a 4 or 5 bit capacity. The output of counter 110 is supplied to comparator 111. Comparator 111 is a group of logic circuits which provide a binary 0 output to AND gate 112 if the contents of counter 110 are within a selected range, and a binary 1 otherwise. The output of AND gate 112 is the error signal which indicates an excessively distorted AC half cycle. In certain cases comparator 111 may be simply the overflow indication of counter 110.

Figure 3:
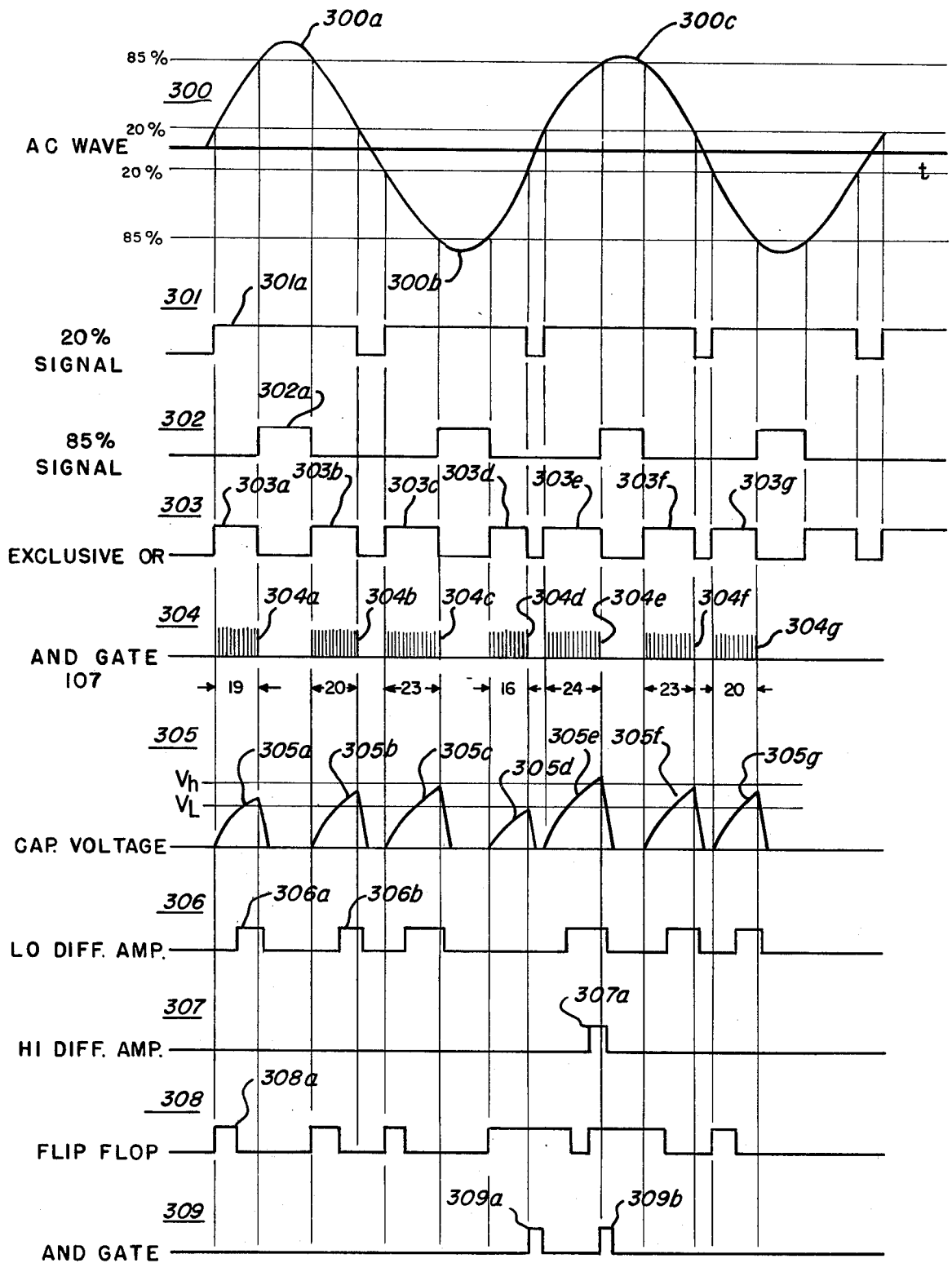
FIG. 3 discloses a simple AC wave and signals generated by the apparatus of FIGS. 1 and 2 when receiving that wave.

In understanding the operation of this circuit and that of FIG. 2, it is useful to learn the time relationships of the waveforms of FIG. 3. The equation for the instantaneous voltage V, of the ideal AC wave can be written as $$V = A \sin 360ft \qquad (i)$$

where $A$ is the peak amplitude, $f$ is the frequency in hertz and $t$ is the time in seconds. To determine the time for V to change from a first percentage of peak amplitude P1, to a second percentage P2, equation (i) can be solved and written as $$t(P2) - t(P1) = (\arc \sin P2 - \arc \sin P1)/360f \qquad (ii)$$

The time between the ideal sine wave's reaching its 20% and 85% excursions, e.g. with a 60 hertz wave can be expressed as $$t(85\%) - t(20\%) = [(\arc \sin 0.85 - \arc \sin 0.20)/21.6] = 2.16 \text{ ms}.$$

which is the duration of pulses 303a and 303b if half cycle 300a has an ideal sine shape. It can be safely assumed that even with worst possible distortion the time between the 20% and 85% voltage excursions for a 60 hertz wave will never exceed 4 ms.

The operation of the apparatus of FIG. 1 can be explained as follows: sample AC waveform 300 comprises an approximately normal half cycle 300a, a peak shifted half cycle 300b, and a half cycle 300c containing odd harmonic in-phase distortion. As half cycle 300a passes through rectifier 101 and level detectors 102 and 103, the level detectors produce at their outputs respectively pulses 301a and 302a. These are applied to exclusive OR circuit 104 causing that circuit to produce pulses 303a and 303b. Each change in the output of exclusive OR gate 104 from binary 1 to binary 0 produces a change from 0 to 1 at the inverter 105 output. This change propagates through delay 108 and a time T later is applied to the input of one-shot 109, causing counter 110 to be cleared. Delay time T plus one-shot 109 set time should be chosen to be less than the shortest possible time between adjacent pulses 303a, 303b, etc. from exclusive OR gate 104. In practice, this usually means that the time between adjacent 20% excursions of the opposite sign is the controlling factor. For even a highly distorted cycle of the 60 hertz wave described above, the shortest possible time interval between plus 20% and minus 20% excursions is about 0.5 ms. Therefore, a convenient time T for delay 108 is 200 us and a convenient set time for one-shot 109 is 50 us. After one-shot 109 clears counter 110, the apparatus is ready to begin timing the next pulse from exclusive OR gate 104.

There will always be some inaccuracy in the measurement of waveform 303 pulse durations with oscillator 106 running free. An acceptable compromise is to choose oscillator 106 cycle time short enough so that the oscillator cycle time is shorter than the tolerance allowed on the width of waveform 303 pulses. It is also true that the time between adjacent 20% and 85% voltage points need not be exactly that of an ideal sine wave (2.16 ms for a 60 hertz wave) to indicate an acceptable half cycle. Experience shows that a variation of up to ± 10% in $t(85\%) - t(20\%)$ from the sine wave value is satisfactory. This corresponds to an acceptable waveform where $t(85\%) - t(20\%)$ is at least 1.94 ms. and no greater that 2.38 ms. For this example, an oscillator 106 cycle time of 108 us. is convenient and also provides acceptable accuracy in measuring the actual time of wave 303 pulses.

With oscillator 106 cycle time of 108 us, counter 110 can conveniently have a 5 bit capacity, enabling it to accumulate times up to 3.35 ms. Depending on when the leading edges of pulses 303a, 303b, etc. from exclusive OR circuit 104 occur relative to the oscillator 106 pulses such a pulse of precisely 2.16 ms. may cause 19, 20, or 21 pulses to be emitted from AND gate 107 and cause counter 110 to be incremented to a contents of 19, 20, or 21. The ± 10% range can be approximated by considering final counter 110 contents correct if between 17 and 23 inclusive.

Turning to FIG. 3, the AND gate output waveform 304 shows 19 output pulses from AND gate 107 during the leading edge of half cycle 300a and 20 pulses during its trailing edge, generally denoted by reference numbers 304a and 304b. The trailing edge of each pulse from exclusive OR circuit 104 causes one-shot 113 to set, placing a 1 input on one terminal of AND gate 112. Comparator 111 is designed to produce a binary 0 output whenever the signal received by it from counter 110 indicates the counter contents are within the aforementioned 17 to 23 range. An output of 0 from comparator 111 maintains the output of AND gate 112 as 0 while the output of one-shot 113 is 1. While counter 110 is incrementing from 0 toward 17, comparator 111 supplies a 1 output to AND gate 112. But since the output of one-shot 113 is at this time 0, the output of AND gate 112 is still 0. Therefore, whenever the final contents of counter 110 is within the aforementioned range at the time of occurrence of the trailing edge of an exclusive OR circuit 104 output pulse, the output of AND gate 112 will always remain 0 as shown by waveform 309.

Although the actual design of comparator 111 is not shown, it is believed that those skilled in the art would have no problem in making a suitable design. One simple approach would be to provide seven 5-input AND gates, each AND gate corresponding to one of the 7 counter contents (17–23) corresponding to an exclusive OR circuit output pulse of the proper length. One input of each of these AND gates receives the appropriate output from one flip-flop of counter 110, which output terminal (0 or 1) of each particular flip-flop depending on the value to be detected. By properly connecting these 7 AND gates to the flip-flops of counter 110, one AND gate will have all 5 of its inputs equal to 1 and therefore supply a 1 output, whenever counter 110 contents is in the 17 to 23 range. An OR gate having 7 inputs receives the output from each of the AND gates, and an inverter of the output of the OR gate provides the desired comparator 111 output. Of course, it may well be possible to employ much less complex circuitry to perform the same function, but no need is seen to discuss this in great detail because the appropriate technique is trivial, and will vary drastically with changes in the count range to be detected.

The negative-going edge of each exclusive OR circuit 104 output causes inverter 105 to create a change in its output signal from 0 to 1 which also is applied to delay 108. After time T has elapsed, one-shot 109 is set, clearing counter 110. This causes comparator 111 to produce a 1 output. As previously mentioned however, the set time of one-shot 113 is shorter then the delay time T of delay 108 and hence the output of one shot 113 has reset to 0, disabling AND gate 112 before the output of comparator 111 has become 1.

The clearing of counter 110 completes the operations for the leading edge of half cycle 300a. A similar operation occurs for the trailing edge of half cycle 300a and the leading edge of half cycle 300b, since the corresponding output pulses 303b and 303c cause respectively 20 and 23 pulses to be placed on the INCR input of counter 110, as is shown in pulse groups 304b and 304c. At some point between the trailing edge of pulse 303c and the leading edge of pulse 303d counter 110 is cleared again. At the leading edge of pulse 303d counter 110 is again incremented, but at the trailing edge of pulse 303d, the contents of counter 110 is only equal to 16 as shown by pulse group 304d. When the trailing edge of pulse 303d occurs, the output of inverter 105 changes to 1 and causes the output of one-shot 113 to become 1. Comparator 111 is still producing a 1 output because the 16 contained in counter 110 is not within the 17 to 23 range which comparator 111 is designed to signal with a 0 output. Therefore AND gate 112 produces a 1 output denoting an excessively distorted half cycle, for processing by external equipment. When the set time of one-shot 113 expires, its output returns to 0 and the output of AND gate 112 becomes a 0 also. At some time thereafter, but before the leading edge of pulse 303e, the 0 to 1 change from inverter 105 progresses through delay 108 and sets one-shot 109, clearing counter 110 and preparing it for processing of pulse 303e. Pulse 303e is of such length that it produces a pulse group 304e comprising 24 pulses, also outside the preselected count range. Again, comparator 111 produces an output which changes from 0 to 1 as the contents of counter 110 increases from 23 to 24. The trailing edge of pulse 303e causes one-shot 113 to be set and AND gate 112 to again produce a 1 output. Thus, it can be seen that whenever counter 110 does not contain a value in the 17 to 23 range at the trailing edge of a pulse in waveform 303, AND gate 112 produces a 1 output for a period of time immediately following, and this can be utilized by external equipment as an indication of improper shape of the half cycle involved.

The proper relationship between the set times of one-shots 109 and 113 and the delay time T of delay 108 can be understood from the above explanation. T plus the set time of one-shot 109 must be less than the minimum time possible for waveform 300 between adjacent 20% excursions to insure that counter 110 has been cleared and the clear signal from one-shot 109 has been removed from it before the leading edge of the preceding pulse in waveform 303. For a 60 hertz sine wave, the time between adjacent 20% points is slightly over 1 ms. The previously mentioned 200 us and 50 us. are good choices for T and one-shot 109 set time, respectively since a 50 us. pulse is more than sufficient to clear even the slowest designs for counter 110 and 250 us. is much less than the time between 20% excursions in even the most distorted of waves. The set time of one-shot 113 must be less than T so as to avoid production of a spurious error signal from AND gate 112 caused by clearing of counter 110 before one-shot 113 resets to 0. A suitable arbitrary value for the set time of one-shot 113 can be arbitrarily chosen up to, say 19. us., assuming T of delay 108 of 200 us. Another assumption which has been made is that comparator 111 produces its correct output in the time it takes for the trailing edge of each pulse and wave form 303 to travel through inverter 105 and cause the output of one shot 113 change to 1. Because an efficient (from a component count standpoint) comparator may have several logic stages within it, its correct output may not be attained until after one-shot 113 is set. To avoid a "race" condition which may cause a spurious error signal, a short delay, equal to this settling time of comparator 111 may be necessary between the output of inverter 105 and the input of one-shot 113 if inverter 105 is fast and comparator 111 is slow. Those skilled in the art, of course, will have no difficulty in appropriately modifying the design to avoid these problems.

FIG. 2 discloses an analog method of timing the length of individual pulses in waveform 303. Operation is identical to that of FIG. 1 through the production of waveforms 301a and 302a. Although exclusive OR circuit 104 has been replaced by AND gate 219, the output of both are identical in this case, where the output of 85% level detector 103 can be 1 only when the output of 20% level detector 102 is 1. AND gate 219 produces a 1 output when inputs 219a and 219b are 1 and 0 respectively, and a 0 otherwise. The output of AND gate 219 is applied to the integrator comprising resistor 205 and capacitor 206. Voltage of capacitor 206 is applied to the + terminals of the high and low differential amplifiers 207 and 208. Standard voltages Vh and $V_L$ are applied to the − terminals of high and low differential amplifiers 207 and 208 respectively. Voltage Vh is slightly higher then $V_L$, and both may be formed by properly selected zener diodes connecting these terminals to ground. When the voltage on the + terminal of a differential amplifier is less than that on a − terminal, the output of the amplifier is driven low. When the plus terminal voltage exceeds that on the minus terminal the output is driven high. Because of the extremely high voltage gain in differential amplifiers, output voltage changes only when the difference between input terminal voltages is very small, usually only when less than 1/20th of a volt or so. Therefore, these differential amplifiers are efficient voltage crossover detectors. Their outputs are clamped with zener diodes to ground such that when the + terminal voltage is less then that on the − terminal, the output is a logical 0 and when the + terminal voltage is greater than that on the − terminal the output is the voltage corresponding to logical 1. The output of high differential amplifier 207 is applied to a first terminal of OR gate 213. The output of low differential amplifier 208 is applied to one-shot 211, whose output in turn is applied to the clear (C) terminal of flip flop 212.

The output of AND gate 219 is also used for timing purposes in connection with manipulation of flip-flop 212 and the gating of the error signal. The output of AND gate 219, represented by waveform 303, is applied to one-shot 214, whose output in turn is applied to the second terminal of OR gate 213. OR gate 213 output is applied to the set terminal of flip-flop 212. The output of AND gate 219 is also applied to the input of inverter 215 whose output is applied to the input of one-shot 217. The output of one-shot 217 is applied to a first terminal of AND gate 218. The second input of AND gate 218 is supplied by the 1 output of flip-flop 212. The output of AND gate 218 comprises the error signal.

The operation of the apparatus of FIG. 2 will also be explained with reference to waveform 300, which it may be recalled has a good first half cycle 300a and a second half cycle 300b who trailing edge is too short between its 20% and 85% points. The leading edge of half cycle 300c between 20% and 85% points is too long, again indicative of an improper half cycle. AND gate 219 produces an output waveform 303 identical to that produced by exclusive OR gate 104, as previously mentioned. Each such pulse is applied through resistor 205 to cause capacitor 206 to charge. To use an RC circuit integrator as a timing device, the well known rules of capacitive charge can be applied to determine the values of the components involved. As a typical example, assume that a logical 1 from AND gate 219 is represented by 5 volts and a logical 0 is represented by 0 volts. Assume further that 3 volts be chosen as the voltage to be attained by capacitor 206 while timing the length of an individual pulse in waveform 303 of 2.38 us., the longest associated with an undistorted half cycle. The formula governing the voltage Vc of capacitor 106 receiving a constant voltage input of 5 volts is given by $$Vc = 5(1-e^{-t/RC})$$

where R is the combined resistance of resistor 205 and the internal resistance in AND gate 219; C is the capacitance of capacitor 206; Vc is the voltage across capacitor 206; and t is the time period AND gate 219 produces a 1 output. Picking a convenient value of 20,000 ohms for R, setting $t = 2.38$ ms. as the maximum length of the pulses in wave form 303 indicative of a good half cycle, and setting $Vh = 3$ v., the above equation can be solved to determine the proper value C for capacitor 206 as 0.13 ufd. Using this value for capacitor 206 and the minimum time for a good pulse in waveform 303 as 1.94 ms., the minimum acceptable value of voltage Vc across capacitor 206 is 2.63 v. Therefore, $V_L$ must be set to 2.63 v. and Vh must be set to 3.00 v.

In describing the remainder of FIG. 2's apparatus, it is convenient to again consider the effect of pulse 303a first, and then the effect of too-short pulse 303d and too-long pulse 303e. As will be explained later, capacitor 206 will always be fully discharged at the start of the leading edge of each pulse in wave form 303. Further, assume that all logic elements are compatible with AND gate 219. Upon the start of pulse 303a, AND gate 219 begins supplying current charging capacitor 206 through resistor 205. Simultaneously, the positive-going leading edge of pulse 303a sets one-shot 214, producing a pulse which causes OR gate 213 to apply a pulse of similar length to the set (S) terminal of flip-flop 212. The length of each pulse issued by one-shot 214 need only be long enough to set flip-flop 212, and should be shorter than the time required for capacitor 206 to charge to voltage $V_L$, or 2.63 v. in the example. A convenient one-shot 214 set time is 100 us.

Capacitor 206 voltage is shown by waveform 305. When the voltage of pulse 305a reaches $V_L$ the output of low differential amplifier 208 changes from a logical 0 to a logical 1, shown as the leading edge of pulse 306a. This change sets one-shot 211 causing flip-flop 212 to be cleared. If the voltage peak in pulse 305a never attains voltage $Vb$, the trailing edge of pulse 303a will be reached without further change in the state of flip-flop 212. The trailing edge of each pulse from AND gate 219 causes one-shot 217 to be set. This gates the contents of flip-flop 212 through AND gate 218 and comprises the error signal received by other apparatus. The output of one-shot 217 also closes switch 210 discharging capacitor 206 through resistor 209, in preparation for the next pulse in waveform 303. The duration of the set time for one-shot 217 is subject to the same constraints as for one-shot 113 in FIG. 1, as well as the time required to discharge capacitor 206 to essentially 0 volts. By choosing switch 210 of relatively high current capacity and resistor 209 of relatively low value, it always is possible to discharge capacitor 206 within a given time limit, and hence this restriction on set time of one-shot 217 is not critical. The trailing edge of each capacitor voltage pulse 305a, etc. is shown as completely discharging before the leading edge of the succeeding pulse of wave form 303.

For each pulse in waveform 305 whose maximum exceeds $V_L$ but does not exceed $Vh$, operation is identical. For a too short pulse such as pulse 303d, capacitor 206 voltage does not reach $V_L$, as pulse 305d displays. In this case, low differential amplifier 208 does not produce a logical 1 output during that pulse, and hence flip-flop 212 is not cleared, shown by the absence of a corresponding pulse in waveform 306. When one-shot 217 is set by the trailing edge of pulse 303d, the output of AND gate 218 changes from a logical 0 to a logical 1 providing an error signal. When a too-long pulse from AND gate 219 occurs, (such as pulse 303e) the output of high differential amplifier 207 changes from a logical 0 to a logical 1 as is shown by pulse 307a, whose leading edge coincides with the time at which pulse 305e reaches voltage $Vh$. This logical 1 is transmitted through OR gate 213 to cause flip-flop 212 to be reset. Again, the trailing edge of the pulse from AND gate 219, in this case pulse 303e, causes one shot 217 to be set and the output of the 1 terminal of flip-flop 212 to appear on the output terminal of AND gate 218, again indicating an error. This error signal pulse is shown as pulse 309b. The trailing edge of pulse 303e again causes switch 210 to close and discharge capacitor 306 through resistor 209 in preparation for timing the trailing edge of half cycle 300c.

These two circuits show different embodiments for accomplishing the timing of the specified portions of the half cycles. Many variations are possible. It may be desirable to choose other than the 20% and 85% power wave points as the boundaries of the sampled time period. These choices may well depend on the characteristics of other loads on the line because of particular potentially detrimental effects which they have on the power supplies. In the case where three phase power is employed, a separate detection circuit for each phase is necessary. The error signal output from each can be combined in a 3 input OR gate to provide a single error indication for processing by the apparatus.

The foregoing describes the invention.

What is claimed is:

1. Apparatus for detecting distortion in a phase of an AC power wave of predetermined nominal frequency and peak amplitude, comprising
   a. voltage detecting means receiving the AC wave for providing a first signal when the AC wave reaches a preselected first percentage of nominal peak amplitude and a second signal when the AC wave reaches a preselected second percentage of nominal peak amplitude, said second percentage being greater than the first;
   b. timing means receiving the voltage detecting means' first and second signals and providing a timing signal encoding the time between the start of adjacent first and second signals in a preselected half cycle of the AC wave; and
   c. comparison means for comparing the difference between the time encoded in the timing signal and the time elapsed between adjacent first and second peak amplitude percentages of a sine wave of the same predetermined nominal frequency and amplitude as the AC wave, and supplying an error signal if different by more than a predetermined amount.

2. The apparatus of claim 1, wherein the voltage detecting means further comprises means for providing the first and second signals during both positive and negative excursions of the AC wave phase.

3. The apparatus of claim 1, wherein the first and second percentages are respectively approximately 20% and 85% of the nominal peak amplitude.

4. The apparatus of claim 1, wherein the voltage detecting means comprises first and second voltage threshold detectors receiving the AC wave and providing the first and second signals respectively while the voltage excursion of the AC wave exceeds respectively the preselected first and second percentages; and wherein the timing means comprises a gate circuit receiving the first and second signals and providing an output signal during coincidence of the first signal and the inversion of the second signal.

5. The apparatus of claim 4, wherein the comparison means comprises
   a. an oscillator having a preselected cycle time and producing one pulse during each cycle;
   b. an AND gate receiving the output of the oscillator on one input and the output of the gate circuit on the other output;
   c. a counter advancing responsive to each pulse received on an increment terminal thereof, resetting to 0 responsive to a clear signal on a clear terminal thereof, and supplying an output encoding the counter contents, and receiving the AND gate output on the increment terminal; and
   d. a comparator receiving the outputs of the counter and the gate circuit and responsive to the trailing edge of the gate circuit output, comparing the counter contents encoded in the counter output signal with a preselected count and if different by more than a preselected deviation, supplying the error signal, wherein the preselected count approximately equals the elapsed time between a positive half cycle of a sine wave of the predetermined nominal frequency and peak amplitude attaining the first voltage percentage and the second percentage next following, divided by the oscillator cycle time;
   and further comprising control means receiving the gate circuit output, and responsive to each trailing edge thereof supplying a clear signal to the counter after a predetermined time less than the duration of the shortest probable second signal pulse.

6. The apparatus of claim 4, wherein the comparison means comprises
   a. an integrator receiving the gate circuit output and providing a signal encoding the integral thereof, and responsive to a clear signal providing a signal encoding a 0, and
   b. a comparator receiving the output of the integrator and the gate circuit output for, responsive to each trailing edge of the gate circuit output, comparing the integrating output with a preselected value and if different by more than a preselected deviation, supplying the error signal, wherein the preselected value is that attained by an identical integrator receiving the exclusive OR circuit output for a time equaling the elapsed time between a positive half cycle of a sine wave of the predetermined nominal frequency and peak amplitude attaining the first voltage percentage and the second percentage next following;

and further comprising control means receiving the gate circuit output and responsive to each trailing edge thereof supplying a clear signal to the integrator after a predetermined time less than the duration of the shortest probable second signal pulse.

7. The apparatus of claim 4, wherein the first and second voltage excursion levels respectively equal approximately 20% and 85% of the nominal peak amplitude.

* * * * *